United States Patent [19]

Wolkstein

[11] 4,338,528

[45] Jul. 6, 1982

[54] OPTIMIZATION CIRCUIT FOR A SERRODYNE FREQUENCY TRANSLATOR

[75] Inventor: Herbert J. Wolkstein, Livingston, N.J.

[73] Assignee: RCA Corporation, New York, N.Y.

[21] Appl. No.: 162,024

[22] Filed: Jun. 23, 1980

[51] Int. Cl.³ .......................... G01S 7/38; H03L 7/04
[52] U.S. Cl. ................................. 307/511; 307/320; 328/55; 333/139; 343/18 E
[58] Field of Search ................. 328/55, 56; 307/511, 307/320; 343/18 E; 333/139, 174

[56] References Cited

U.S. PATENT DOCUMENTS

| | | | |
|---|---|---|---|
| 3,110,004 | 11/1963 | Pope | 307/320 |
| 3,748,499 | 7/1973 | Schaffner | 307/511 |
| 3,851,256 | 11/1974 | Levasseur et al. | 328/55 |
| 3,882,431 | 5/1975 | Hopwood et al. | 333/139 |
| 3,982,214 | 9/1976 | Burns | 328/56 |
| 4,297,641 | 10/1981 | Sterzer | 343/18 E |

*Primary Examiner*—John S. Heyman

*Attorney, Agent, or Firm*—Samuel Cohen; Robert L. Troike; Raymond E. Smiley

[57] ABSTRACT

A serrodyne includes a phase shifting circuit adapted to receive a sawtooth modulating signal for providing frequency translation of a radio frequency signal which can be at any of a range of input frequencies. The serrodyne also includes a discriminator which produces in response to the input RF signal a voltage of amplitude proportional thereto. The serrodyne further includes a circuit producing a sawtooth voltage waveform of period $1 \div m$, where m is the amount of frequency shift desired in the serrodyne. The sawtooth waveform is applied to the phase shifting circuit. The sawtooth waveform is amplified by an amplifier to which is applied the sawtooth voltage waveform and the signal from the frequency discriminator. The amplification is such that the peak-to-peak magnitude of the amplified waveform is dependent on the amplitude value of the voltage from the frequency discriminator and causes the serrodyne frequency to be shifted by 360° at any of the range of input frequencies.

9 Claims, 1 Drawing Figure

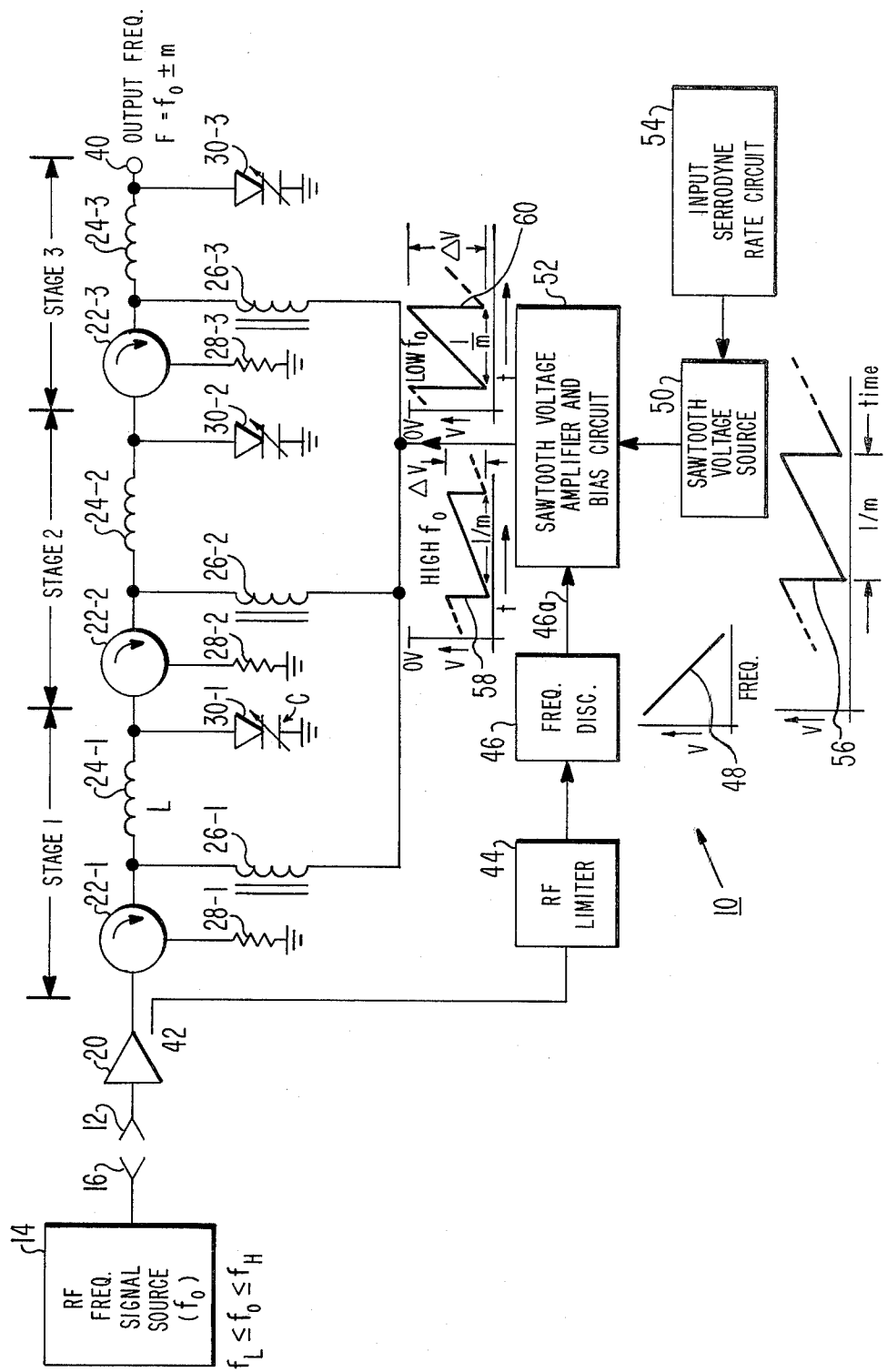

OPTIMIZATION CIRCUIT FOR A SERRODYNE FREQUENCY TRANSLATOR

This invention is concerned with frequency translators and more particularly with serrodyne type translators optimized to provide the desired frequency translation independent of input frequency.

A frequency translator, given an input frequency signal of a certain value, will produce an output signal having a frequency shifted by a desired amount from that of the input. A serrodyne is a frequency translator which produces an output frequency shifted by a desired amount from an input frequency while suppressing the input frequency and typically employs linear sawtooth modulation of transit time of the signals through the translator. A basic paper on serrodyne frequency translators is by R. C. Cumming, "The Serrodyne Frequency Translator", Proc. IRE, pp. 175–186, February, 1957.

Frequency translators are particularly useful in electronic countermeasure (ECM) systems for supplying to an enemy doppler speed sensor an erroneous frequency signal causing it to incorrectly determine speed. ECM systems are commonly subject to input frequencies from various energy sources ranging from a low frequency, $f_L$, to a high frequency $f_H$, and having a center frequency $f_C$. It is important that the frequency translator suppress the input frequency and resulting sidebands resulting from the translation by a considerable amount so that the enemy equipment cannot detect it and will thus only detect the translated frequency. A formula for input frequency suppression at a frequency $f_O$ removed from $f_C$ in a serrodyne circuit with the serrodyne sawtooth voltage adjusted to produce 360° phase shift of the input signal at a center frequency $f_C$ is as follows:

$$\text{Suppression (dB)} = 20 \log \frac{(\pi n B \div 2) - 1}{\sin (\pi n B \div 2)} \quad (1)$$

where $B = |f_O - f_C| \div f_C$ and $n = \pm 1$ as described in the aforementioned Cumming article. Thus, as will be seen from an analysis of equation 1, the further $f_O$ is from $f_C$ the less the suppression which is an undesired situation.

In accordance with a preferred embodiment of the invention, in a serrodyne circuit including means producing a sawtooth waveform signal of repetition period $1 \div m$ and a phase shifting means receptive of the sawtooth waveform and an input frequency $f_O$ for shifting the phase of the input frequency at a rate such as to produce an output frequency F where $F = f_O \pm m$, comprises means responsive to the input frequency for producing a signal having an amplitude proportional to the input frequency. The means producing a sawtooth waveform includes means responsive to the signal having an amplitude for producing said sawtooth waveform with a peak-to-peak amplitude proportional to the signal amplitude where the proportionality is such as to cause the phase shifting means to produce a 360° phase shift of the input frequency.

In the drawing:

The sole FIGURE is a serrodyne circuit optimized for input frequency value in accordance with the invention.

Referring now to the sole FIGURE, a serrodyne circuit 10 is receptive at antenna 12 of a radio frequency (RF) signal from a remote source 14 which transmits signals from antenna 16. Source 14 transmits signals typically of unknown frequency $f_O$, where $f_O$ lies between low frequency $f_L$ and some high frequency $f_H$. Alternately, source 14 may be part of serrodyne circuit 10 eliminating the need for antennas 12 and 16.

As illustrated, antenna 12 is coupled to a conventional amplifier 20 which provides suitable amplification to the RF signal received thereat. Amplifier 20 is coupled to one port of a first three-port circulator 22-1. A second port of the circulator 22-1 is coupled via an inductor 24-1 of value L to varactor diode 30-1 of a value C. Also coupled to the second port is RF choke coil 26-1. A circulator load 28-1 is coupled between the third port of circulator 22-1 and reference ground. Varactor diode 30-1 is, for example, a hyperabrupt junction diode coupled between inductor 24-1 and reference ground and providing a capacitance value depending upon the bias level provided via RF choke coil 26-1.

Components 22-1, 24-1, 26-1, 28-1 and 30-1 form a first stage of serrodyne circuit 10. As will be described more fully hereinafter, the stage 1 components are typically capable of shifting the phase of the signal provided thereto from amplifier 20 by about 120°.

In a manner similar to that described above in connection with stage 1, the junction of inductor 24-1 and varactor diode 30-1 of stage 1 is coupled to circulator 22-2 of serrodyne 10 stage 2 and the junction of inductor 24-2 and varactor diode 30-2 is coupled to circulator 22-3 of serrodyne 10 stage 3. Stages 2 and 3 have components identical to those in stage 1 and the components are identically arranged. The junction of inductor 24-3 and varactor diode 30-3 is coupled to an output terminal 40 which produces frequency F.

A directional coupler 42 is arranged to pass a portion of the signal produced by amplifier 20 to an RF limiter 44. Limiter 44 is coupled to a frequency discriminator 46 which produces an output signal of voltage amplitude inversely proportional to the frequency applied thereto as illustrated in waveform 48. Waveform 48 illustrates that as the frequency of source 14 increases the voltage amplitude from discriminator 46 decreases and vice versa.

Discriminator 46 and a sawtooth voltage source are coupled to separate inputs of a sawtooth voltage amplifier and bias circuit 52. An input serrodyne rate circuit 54 is coupled to sawtooth voltage source 50 to control the period $(1 \div m)$ of the sawtooth voltage waveform 56 which determines the amount of frequency shift of frequency $f_O$. Amplifier 52 is coupled, respectively, via each of RF chokes 26-1, 26-2, and 26-3, and inductors 24-1, 24-2, and 24-3 to varactor diodes 30-1, 30-2, and 30-3. Amplifier 52 provides gain to the signal produced by source 50 in accordance with the signal produced by discriminator 46 and adds an appropriate fixed DC bias such that each of varactor diodes 30 operate in their linear region of operation. (Hereinafter when a group of elements having the same prefix number is referred to the suffix number will be dropped. Thus "diodes 30" is the same as diodes 30-1, 30-2 and 30-3).

Thus, for a relatively high input frequency $f_O$, amplifier 52 produces a relatively low peak-to-peak amplitude output sawtooth signal as illustrated in waveform 58. For a relatively low frequency $f_O$, amplifier 52 produces a relatively large peak-to-peak output signal as illustrated in waveform 60.

The principle of operation of the serrodyne circuit 10 is based on the phase shift characteristics of a distributed equivalent transmission line circuit. For each of the three phase shift stages illustrated in the FIGURE there is an inductance L such as 24-1 and a capacitance C provided by a varactor diode such as 30-1. The phase shift $\beta$ for such a circuit is:

$$\beta = 2\pi f_O \sqrt{LC} \qquad (2)$$

where $f_O$ is the input frequency. Thus, if L or C change value, $\beta$ changes. With an input frequency $f_O$ in the gigahertz range, it has been determined that a hyperabrupt varactor diode operating in its linear region (i.e., in that region where there is approximately a straight line relationship between the amplitude of the instantaneous voltage supplied to the diode and its capacitance) can produce changes in the value of C as a function of bias voltage such as to produce a phase shift $\beta$ of 120°. A typical example of a hyperabrupt diode is Microwave Associates Type No. 46626. The value of inductance 24-1, 24-2, or 24-3 is 1 nanohenry and DC bias is about −4 volts. Therefore, three such stages can produce a total of 360° which is required for operation of the serrodyne. Clearly, if the phase shift of one stage is in excess of 90° but less than 120°, four such stages are required. Conversely, if some sort of capacitance device is available which can produce a phase shift in accordance with formula (2) of 180° then only two such stages as illustrated in the FIGURE are required. It also follows from a review of equation (2) that a variable inductance can be utilized rather than or in addition to a variable capacitance.

The output signal V, at terminal 40, as a function of time t of a phase shifting circuit can be expressed as $$V = A \cos(\omega - k)t \qquad (3)$$

where A = magnitude of the output signal carrier, $\omega = 2\pi f_O$ is the input signal frequency and k is the slope of the modulation signal. With reference to waveforms 58 and 60, for example, $k = \Delta V \div 1 \div m = \Delta V \cdot m$. For a phase shifter which can shift phase 360° such as serrodyne circuit 10, it will be noted from equation (3) that the output frequency is decreased relative to the input frequency if k is positive while the output frequency is increased relative to the input frequency if k is negative. Therefore, the output frequency F may be greater than or less than the frequency $f_O$ by the amount m depending on whether the sawtooth waveform increases as illustrated in waveforms 56, 58, and 60, or decreases with time. That is:

$$F = f_O \pm m \qquad (4)$$

Operation of the serrodyne circuit 10 is as follows. Source 14 produces at antenna 16 an RF signal $f_O$ of unknown value but between a relatively low value $f_L$ and a relatively high value $f_H$. The only reason for requiring a prior knowledge of the upper and lower frequency limits is to allow circuit component values to be specified. The RF signal is received by antenna 12 and amplified by antenna 20. The amplified RF signal is applied to varactor diode 30-1 and the reflected and phase shifted RF signal from diode 30-1 is applied back through varactor diode 30-1 to the first port of second circulator 22-2. Similarly, the RF signal is applied from the second port of circulator 22-2 to varactor diode 30-2 and the reflected and additionally phase shifted RF signal from diode 30-2 is applied to the first port of circulator 22-3. The reflected RF signal at the second port of circulator 22-3 is applied to varactor diode 30-3 and the reflected further phase shifted signal is applied to output terminal 40. Concurrently, the signal is applied to discriminator 46 having been leveled by limiter 44. Discriminator 46 produces on line 46a a signal, the magnitude of which is proportional to $f_O$. Also, concurrently, sawtooth voltage source 50 is producing a sawtooth waveform of a given peak-to-peak amplitude and with period of value $(1 \div m)$ determined by the signal produced by circuit 54. The value m is equal to the amount of frequency shift desired of $f_O$. The value m may be changed as a function of time as desired to change the amount of frequency shift. The sawtooth waveform produced by source 50 is amplified by amplifier 52 to a signal such as shown, for example, in waveforms 58 or 60 having a peak to peak magnitude of $\Delta V$ determined by the signal from discriminator 46, (proportional to $f_O$) and applied through chokes 26 and inductors 24 to varactors 30. The resulting signal includes a fixed bias produced by circuit 52 to bias the varactor diodes 30 into their linear region of operation and causes a continuous change in capacitance of each of varactor diodes 30 with a discontinuity each time the sawtooth waveform transitions from a high value to a low value. The peak amplitude $\Delta V$ of the waveform produced by circuit 52 is such that a 360° phase shift occurs at terminal 40 relative to the signal received by antenna 12 at all input frequencies of interest. It has been found that the amplification of circuit 52 is best set experimentally to a value such that 360° phase shift occurs at all input frequencies of interest.

It will be understood that, although serrodyne circuit 10 is illustrated with a varactor diode having an alterable capacitive value, in accordance with equation 1 a phase shifter can utilize an alterable inductor rather than alterable capacitor, or a combination of alterable inductor and alterable capacitor. Furthermore, although the alterable capacitor is described as being a hyperabrupt varactor diode, another diode of the alterable capacitance type may be used so long as a sufficient number of stages are provided to affect a 360° phase shift at the desired frequencies. Further, the signal produced by circuit 52 may be applied to other types of phase shifters than shown, such as, for example, a traveling-wave tube.

It will be also understood that if the frequency $f_O$ from source 14 increases or decreases in value, the amplitude $\Delta V$ of signal produced by circuit 52 will resultingly decrease or increase in amplitude accordingly such as to maintain a 360° phase shift at the output terminal 40 each time a discontinuity occurs in the sawtooth waveform.

What is claimed is:

1. A serrodyne circuit of the type which is receptive of an input signal of frequency $f_O$ for producing an output signal of frequency F and which includes means producing a sawtooth waveform of repetition period $1 \div m$ where $F = f_O \pm m$ and phase shifting means receptive of said input frequency signal and said sawtooth waveform for shifting the phase of said input frequency at a rate to produce said output frequency, comprising in combination:

means responsive to said input frequency signal for producing a signal having a amplitude proportional to the input frequency and wherein said means producing said sawtooth waveform includes means responsive to said proportional amplitude signal for producing said sawtooth waveform with a peak-to-peak amplitude proportional to said signal amplitude, said proportionality being such as to cause said phase shifting means to produce a 360° phase shift of the input frequency.

2. The combination as set forth in claim 1 wherein said means producing a signal proportional to said input frequency comprises a frequency discriminator circuit producing an output voltage of amplitude proportional to the value of said input frequency.

3. The combination as set forth in claim 1 wherein said means producing a signal proportional to said input frequency comprises a frequency discriminator producing an output voltage of amplitude inversely proportional to the value of said input frequency.

4. The combination as set forth in claim 1 wherein said means producing said sawtooth waveform comprises means producing a sawtooth waveform of a fixed amplitude and amplifier means responsive to said sawtooth waveform of fixed amplitude and to said proportional amplitude signal for amplifying the fixed amplitude sawtooth by an amount dependent on the proportional amplitude signal.

5. The combination as set forth in claim 1 wherein said phase shifting means comprises the series combination of first and second reactive elements with reactances of opposite sense wherein the reactance of one of said elements is adjusted for changing the phase of said input signal applied to said circuit.

6. The combination as set forth in claim 5 wherein said adjustable reactance is a capacitive reactance.

7. The combination as set forth in claim 6 wherein said capacitive reactance element is a varactor diode.

8. The combination as set forth in claim 6 wherein said capacitive reactance element is a hyperabrupt varactor diode.

9. The combination as set forth in claim 1 wherein said phase shifting means comprises a plurality of cascaded phase shifting circuits, each circuit comprising the series combination of first and second reactive elements with reactances of opposite sense.

* * * * *